United States Patent
Camberlein et al.

(10) Patent No.: US 9,360,382 B2
(45) Date of Patent: Jun. 7, 2016

(54) DEVICE FOR MEASURING A HEAT FLUX

(75) Inventors: Lionel Camberlein, Le Mans (FR); Etienne Gaviot, Le Mans (FR); Frédéric Polet, Le Mans (FR); Bruno Beche, Saint Jacques de la Lande (FR); Guillaume Failleau, Le Mans (FR); Ronan Morice, Chaville (FR); Véronique Le Sant, Le Mesnil Saint Denis (FR)

(73) Assignee: UNIVERSITE DU MAINE, Le Mans (FR)

(*) Notice: Subject to any disclaimer, the term of this patent is extended or adjusted under 35 U.S.C. 154(b) by 569 days.

(21) Appl. No.: 13/808,676

(22) PCT Filed: Jul. 6, 2011

(86) PCT No.: PCT/EP2011/061371
§ 371 (c)(1),
(2), (4) Date: Apr. 23, 2013

(87) PCT Pub. No.: WO2012/004286
PCT Pub. Date: Jan. 12, 2012

(65) Prior Publication Data
US 2013/0215927 A1    Aug. 22, 2013

(30) Foreign Application Priority Data
Jul. 6, 2010   (FR) .................... 10 55463

(51) Int. Cl.
*G01K 17/00*    (2006.01)
*G01J 5/02*    (2006.01)
(Continued)

(52) U.S. Cl.
CPC .............. *G01K 17/00* (2013.01); *G01J 5/0225* (2013.01); *G01J 5/046* (2013.01); *G01J 5/12* (2013.01);
(Continued)

(58) Field of Classification Search
USPC ............................................. 374/29, 30, 179
See application file for complete search history.

(56) References Cited

U.S. PATENT DOCUMENTS 3,969,149 A * 7/1976 Thomas et al. ............... 136/225
4,049,469 A * 9/1977 Kolomoets et al. ........... 136/225
(Continued)

FOREIGN PATENT DOCUMENTS

| EP | 1 767 913 | 3/2007 |
| FR | 2 704 979 | 11/1994 |
| FR | 2 781 931 | 2/2000 |

OTHER PUBLICATIONS

International Search Report for PCT/EP2011/061371, mailed Oct. 31, 2011.
French-language Written Opinion of the International Searching Authority for PCT/EP2011/061371, mailed Oct. 31, 2011.
(Continued)

*Primary Examiner* — Mirellys Jagan
(74) *Attorney, Agent, or Firm* — Nixon & Vanderhye P.C.

(57) ABSTRACT

The invention relates to a device for measuring a heat flux, comprising a thermopile formed of a plurality of thermojunctions of distributed type. The device is formed of a first and a second ceramic substrate (Ce1, Ce2), a first face of the first substrate (Ce1) is composed of cavities which are separated by ceramic spacers (Ca1, Ca2, Ca3, Ca4), the thermopile is placed on a second planar face of the first substrate which is located opposite the first face, the spacers of the first substrate are arranged beneath one thermojunction (Tj2, Tj4, Tj6, Tj8) in two of the thermopile, a face of the second substrate (Ce2) is composed of cavities which are separated by ceramic spacers (Ca5, Ca6, Ca7, Ca8, Ca9), the spacers of the second substrate rest on a thermojunction (Tj1, Tj3, Tj5, Tj7, Tj9) beneath which a spacer of the first substrate is not arranged.

12 Claims, 5 Drawing Sheets

(51) Int. Cl.
*G01J 5/04* (2006.01)
*G01J 5/12* (2006.01)
*G01K 1/16* (2006.01)
*H01L 35/34* (2006.01)

(52) U.S. Cl.
CPC ............... *G01K 1/16* (2013.01); *G01K 17/006* (2013.01); *H01L 35/34* (2013.01); *Y10T 29/49002* (2015.01); *Y10T 29/4998* (2015.01); *Y10T 29/49117* (2015.01)

(56) References Cited

U.S. PATENT DOCUMENTS

| 4,717,786 | A* | 1/1988 | Thery et al. .................... 136/212 |
| 6,994,468 | B2* | 2/2006 | Thery et al. .................... 374/29 |
| 2003/0152128 | A1* | 8/2003 | Verhaegen .................... 374/30 |

OTHER PUBLICATIONS

Lobach, O.V. et al., "Features of semiconductor fluxmeters", Electron Devices and Materials, (Jul. 1, 2003), pp. 78-80.

* cited by examiner

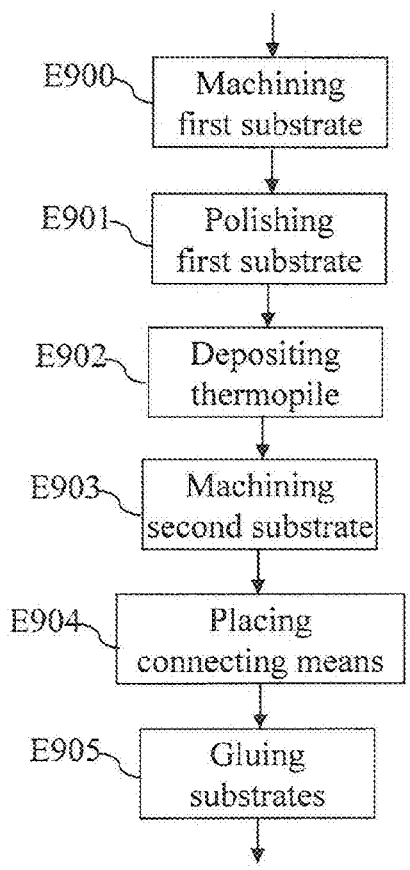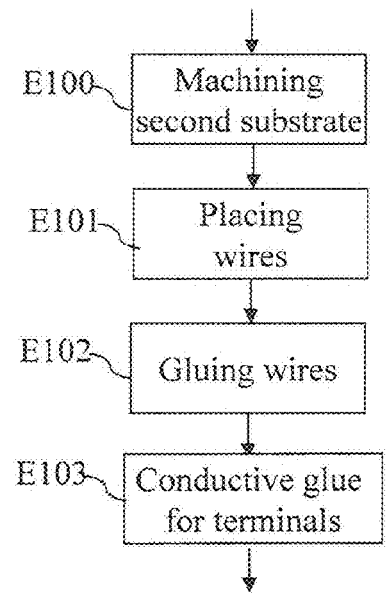
Fig. 9
Fig. 10

DEVICE FOR MEASURING A HEAT FLUX

This application is the U.S. national phase of International Application No. PCT/EP2011/061371, filed 6 Jul. 2011, which designated the U.S. and claims priority to FR Application No. 1055463, filed 6 Jul. 2010, the entire contents of each of which are hereby incorporated by reference.

The present invention relates to a device for measuring heat flux.

Devices for measuring heat flux are based on the use of thermopiles. A thermopile is an electronic component which converts thermal energy into electrical energy. A thermopile is for example formed of thermocouples or cells which are generally connected in series. A cell is formed of two metals or alloys of different natures, for example of copper and constantan or nickel and Chromel®. The metals or alloys are connected by two thermojunctions. Each cell comprises a cooled zone at a first thermojunction and a heated zone at a second thermojunction. Due to the Seebeck effect, the thermocouple generates a potential difference which is dependent on the temperature difference between the thermojunctions.

It should be pointed out here that a thermocouple does not measure a temperature, but a temperature difference.

Patent FR 2781931 discloses a thermopile which comprises a plurality of thermojunctions, which are of distributed type, and are produced on a silicon substrate. The substrate comprises a plurality of zones of thermal discontinuities which exhibit a thermal conductivity which is strictly less than the thermal conductivity of the substrate. The zones of thermal discontinuity are located respectively level with one junction in two.

This type of thermopile is not suitable for measurements of heat flux at high temperatures such as 1000° C.

The aim of the present invention is to solve the drawbacks of the prior art by proposing a device for measuring a heat flux which is suitable for measurements of heat flux at high temperatures such as 1000° C., and which is of high sensitivity.

To this end, according to a first aspect, the invention proposes a device for measuring a heat flux, comprising a thermopile formed of a plurality of thermojunctions of distributed type, characterised in that the device is formed of a first and a second ceramic substrate, a first face of the first substrate is composed of cavities which are separated by ceramic spacers, the thermopile is placed on the planar face of the first substrate which is located opposite the first face, the spacers of the first substrate are arranged beneath one thermojunction in two of the thermopile, a face of the second substrate is composed of cavities which are separated by ceramic spacers, the spacers of the second substrate rest on a thermojunction beneath which a spacer of the first substrate is not arranged.

Thus, by disposing the spacers of the first and second substrates in this manner, the lines of heat flux are concentrated at the level of the spacers of the second substrate, the lower contacts of which force all the heat to pass towards the hot thermojunctions of the thermopile and to pass towards the spacers Ca1 to Ca4.

This duplication of the spacers for the ceramic substrates reduces the thermal conductivity of the device for measuring a heat flux and greatly improves the sensitivity of the device for measuring a heat flux.

This set of substrates permits optimum deflection of the lines of heat passing through the device for measuring heat flux, and makes it possible to obtain a plurality of temperature gradients which are tangential to the thermopile, that is to say in a plane perpendicular to the lines of heat passing through the device for measuring heat flux.

According to a particular embodiment of the invention, the ceramic has a thermal conductivity of between 0.5 and 15 W/m·K.

Thus, a thermal conductivity of between 0.5 and 15 W/m·K makes it possible to obtain different trades-off in terms of sensitivity, response time and overall heat transfer resistance.

According to a particular embodiment of the invention, the ceramic has a thermal conductivity of 1.46 W/m·K.

Thus, a thermal conductivity of 1.46 W/m·K is a trade-off in terms of sensitivity, response time and overall heat transfer resistance.

According to a particular embodiment of the invention, the cavities and the spacers are obtained by machining the substrates.

Thus, the operation is carried out automatically and with a machine which is not very costly. The machining operation advantageously replaces an operation such as for example microtechnological dry etching with straight flanks by RIE (reactive ion etching). This type of etching is lengthy and very expensive.

According to a particular embodiment of the invention, the first and second substrates are glued to one another by means of the spacers of the second substrate, the face of the second substrate which is composed of cavities which are separated, by ceramic spacers, from the second face of the first substrate, and the thermopile.

Thus, the manufacture of a device for measuring heat flux is broken down into simple operations which do not require complex equipment.

According to a particular embodiment of the invention, the thermopile is formed of a continuous strip composed alternatively of deposits of a first and a second metal or alloy of different thermoelectric properties, the continuous strip is meandering and folded to form a quadrilateral, and each deposit of metal or alloy of a meander is juxtaposed with a different deposit of metal or alloy of another meander.

Thus, the continuous nature of the strip of the first conductor makes it possible to avoid breaking the electric circuit in the event of faulty plating by the second deposit of metal or alloy such as for example expansion cracking or mechanical cracking.

Furthermore, arranging the deposits in a checkerboard pattern allows the machining of the substrates to be carried out simply in parallel cuts.

According to a particular embodiment of the invention, the metals or alloys have different electrical conductivities, the deposits of the metal or the alloy having the greater electrical conductivity are carried out on deposits of the metal or the alloy having the lesser electrical conductivity, the deposits of the metal or the alloy having the greater electrical conductivity and the deposits of the metal or the alloy having the lesser electrical conductivity on which the deposits of the metal or the alloy having the greater electrical conductivity are carried out have at their ends a width equal to the width of the deposits of the metal or the alloy having the lesser electrical conductivity and on which no deposit of metal or the alloy having the greater electrical conductivity is carried out, and have in their intermediate part a width which is less than the width of the deposits of the metal or the alloy having the lesser electrical conductivity and on which no deposit of metal or the alloy having the greater electrical conductivity is carried out.

Thus, the arrangement of two metals or alloys with the more conductive one on top makes it possible to benefit from an equivalent relative Seebeck coefficient of optimum value.

Likewise, the signal-to-noise ratio of the device for measuring heat flux is optimised.

According to a particular embodiment of the invention, the thermopile comprises a first and a second contact terminal, each contact terminal being capable of being electrically connected to a wire, and the second substrate is machined in each part facing a contact terminal so as to permit winding of the wire around a block arranged in the centre of the machined part.

Thus, the winding of the wire around the block makes it possible to produce contact terminals which are particularly robust with regard to continuous traction, expansion and mechanical vibrations.

Correlatively, the present invention relates to a method for manufacturing a device for measuring a heat flux, comprising a thermopile formed of a plurality of thermojunctions of distributed type, characterised in that the method comprises the steps of:

- machining a first ceramic substrate on a first face in order to obtain cavities which are separated by ceramic spacers,
- depositing the thermopile on the second planar face of the first substrate, the spacers of the first substrate being arranged beneath one thermojunction in two of the thermopile,
- machining a second ceramic substrate on one face in order to obtain cavities which are separated by ceramic spacers,
- gluing the machined face of the second substrate onto the face of the first substrate comprising the thermopile such that the spacers of the second substrate rest on a thermojunction beneath which a spacer of the first substrate is not arranged.

Thus, by arranging the spacers of the first and second substrates in this manner, the lines of heat flux are concentrated at the level of the spacers of the second substrate, the lower contacts of which force all the heat to pass towards the hot thermojunctions of the thermopile and to pass towards the spacers Ca1 to Ca4.

This duplication of the spacers for the ceramic substrates reduces the thermal conductivity of the device for measuring a heat flux and greatly improves the sensitivity of the device for measuring a heat flux.

This set of substrates permits optimum deflection of the lines of heat passing through the device for measuring heat flux, and makes it possible to obtain a plurality of temperature gradients which are tangential to the thermopile, that is to say in a plane perpendicular to the lines of heat passing through the device for measuring heat flux.

Furthermore, the manufacture of a device for measuring heat flux is broken down into simple operations which do not require complex equipment.

According to a particular embodiment of the invention, the method further comprises a step of polishing the second planar face of the first substrate prior to the depositing of the thermopile.

Thus, it is possible to use machinable ceramics which are not intended for applications of the microelectronics type when they are marketed.

According to a particular embodiment of the invention, the thermopile comprises a first and a second contact terminal, each contact terminal being capable of being electrically connected to a wire, and the method further comprises the step of machining the second substrate in each part facing a contact terminal so as to permit winding of the wire around a block arranged in the centre of the machined part.

According to a particular embodiment of the invention, the method further comprises the steps of:

- winding each wire around the block,
- gluing each wire to the second substrate using a conductive glue,
- establishing an electrical connection between each glued wire and a contact terminal using a conductive glue.

Thus, the winding of the wire around the block makes it possible to produce contact terminals which are particularly robust with regard to continuous traction, expansion and mechanical vibrations.

The characteristics of the invention mentioned above, and others, will become more clearly apparent on reading the following description of an example of embodiment, said description being given in relation to the appended drawings, of which:

FIG. 9 is an example of an algorithm for manufacturing a device for measuring a heat flux according to the present invention;

FIG. 10 is an example of an algorithm for placing connecting means for a device for measuring a heat flux according to the present invention.

According to the present invention, the two substrates Ce1 and Ce2 which constitute the device for measuring a heat flux are ceramic substrates.

The substrate Ce1 has a face which is composed of cavities which are separated by ceramic spacers Ca1 to Ca4.

The substrate Ce2 has a face which is composed of cavities which are separated by ceramic spacers Ca5 to Ca9.

According to a particular embodiment of the present invention, each face which is composed of cavities which are separated by ceramic spacers is obtained by machining said substrate, more precisely by milling said substrate.

Machinable ceramic substrates are for example produced from a machinable ceramic material provided under the trade name MACOR® by the company CORNING®.

The ceramic used according to the present invention has a thermal conductivity of between 0.5 and 15 W/m·K.

The thermal conductivity of the ceramic makes it possible to define the response time, the accuracy and the ability to measure an adiabatic state of the device for measuring a heat flux.

By way of example and in non-limitative manner, the ceramic has a thermal conductivity of 1.46 W/m·K.

When the first substrate is made of MACOR® machinable ceramic, the other face of the ceramic must be polished so as to obtain a surface, the granularity of which is compatible with the thickness of the metals or alloys which are deposited on this face in order to produce the thermopile.

For example, and in non-limitative manner, the granularity of the face on which the thermopile is deposited is of between 600 nm and 1.2 μm.

Figure 1:
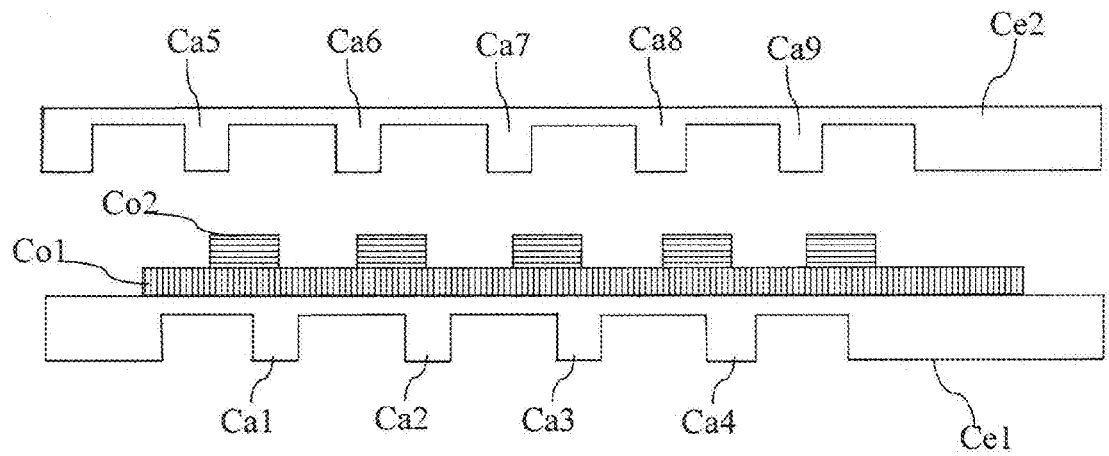
FIG. 1 depicts two substrates which constitute the device for measuring a heat flux according to the present invention.

The two metals or alloys Co1 and Co2 forming the thermopile are represented by vertical and horizontal cross-hatching in FIG. 1. The two metals or alloys Co1 and Co2 are deposited on the polished face of the first substrate Ce1 in a configuration which is referred to as plated, in which the conductor Co2 having the greater conductivity partially covers the conductor Co1 having the lesser electrical conductivity.

Of course, the present invention is applicable when the two conductors are in what is called a juxtaposed configuration, that is to say when the two conductors are juxtaposed.

It should be pointed out that the thicknesses of the conductors Co1 and Co2 shown in FIG. 1, and in particular their relationship to the thicknesses of the ceramics Ce1 and Ce2 and of the spacers Ca1 to Ca9, do not reflect reality.

In one particular example of embodiment, each ceramic substrate has a thickness of 1 mm, each cavity has a width of 1.5 mm and a depth of 0.7 mm, and each spacer has a width of 0.5 mm and a depth of 0.7 mm.

The choice of ceramic as substrate makes it possible to produce a device for measuring a heat flux which is operational at temperatures of the order of 1000° C. Furthermore, the ceramic used according to the present invention has a coefficient of expansion which is compatible with the metals and/or alloys forming the thermopile.

For example, the ceramic has a coefficient of expansion of $93 \cdot 10^{-7}$ m/° C. for temperatures of 25° C. to 300° C., and approaches $125 \cdot 10^{-7}$ m/° C. for approximately 800° C. The thermal conductivity of the ceramic is 1.46 W/m·K between 0° C. and 600° C., and varies from 1.35 to 1.5 W/m·K over its entire application range.

Figure 2:
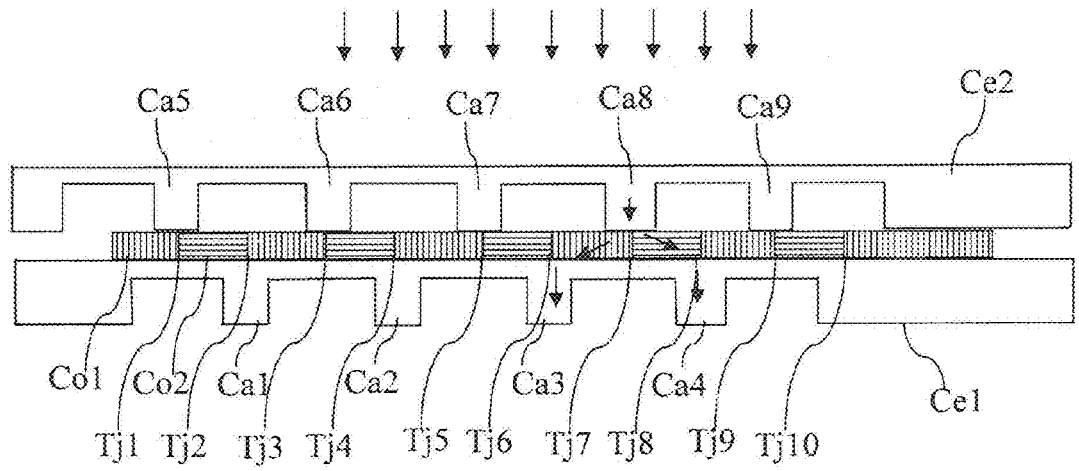
FIG. 2 depicts the device for measuring a heat flux according to the present invention, and also the deflection of the heat flux which is obtained according to the present invention.

FIG. 2 depicts the device for measuring a heat flux according to the present invention, and also the deflection of the heat flux which is obtained according to the present invention.

According to the present invention, the two substrates Ce1 and Ce2 are glued with the aid of a non-electrically conductive glue.

The upper face of the substrate Ce2 is the face which collects the incident heat flux represented by the arrows at the top of FIG. 2.

The spacers Ca5 to Ca9 of the second substrate Ce2 make it possible to obtain a constriction of the lines of heat flux at the level of the spacers Ca5 to Ca9, the lower contacts of which force all the heat to pass towards the hot thermojunctions Tj1, Tj3, Tj5, Tj7 and Tj9.

The hot thermojunctions Tj1, Tj3, Tj5, Tj7 and Tj9 are preferably located beneath the middle of the spacers Ca5 to Ca9.

The spacers Ca5 to Ca9 of the second substrate Ce2 make it possible to obtain a constriction of the lines of heat flux at the level of the spacers Ca1 to Ca4, the lower contacts of which force all the heat of the hot thermojunctions Tj1, Tj3, Tj5, Tj7 and Tj9 to pass towards the spacers Ca1 to Ca4.

This duplication of the spacers for the ceramic substrates Ce1 and Ce2 reduces the thermal conductivity of the device for measuring a heat flux and greatly improves the sensitivity of the device for measuring a heat flux.

The spacers Ca1 to Ca4 of the first substrate Ce1 are arranged beneath one thermojunction Tj2, Tj4, Tj6, Tj8 in two of the thermopile; the spacers Ca5 to Ca9 of the second substrate rest on a thermojunction Tj1, Tj3, Tj5, Tj7 and Tj9 beneath which a spacer Ca1 to Ca4 of the first substrate Ce1 is not arranged.

In FIG. 2, what is called the plated configuration is not shown for simplicity.

It should be pointed out here that the lower face of the substrate Ce1 rests on a heat sink which is not shown in FIG. 2.

Figure 3:
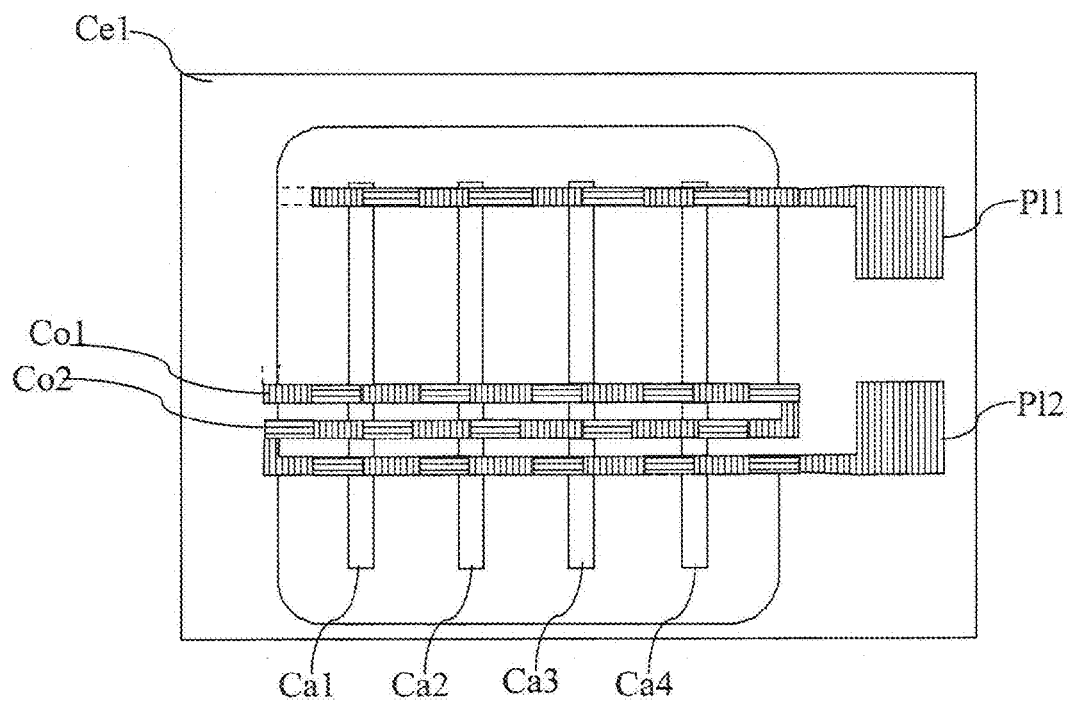
FIG. 3 depicts a diagrammatic representation of the first substrate and the thermopile.

FIG. 3 depicts a diagrammatic representation of the first substrate and the thermopile.

The thermopile is formed of a continuous strip composed alternatively of deposits of a first and a second metal or alloy of different thermoelectric properties. The continuous strip is meandering and folded to form a quadrilateral. Each deposit of metal or alloy of a meander is juxtaposed with a different deposit of metal or alloy of another meander.

This makes it possible to produce the spacers in the form of lines.

In a variant embodiment, each deposit of metal or alloy of a meander is juxtaposed with an identical deposit of metal or alloy of another meander.

According to this variant embodiment, the spacers will be produced in the form of a checkerboard.

The zones with horizontal cross-hatching represent the deposits of the metal or alloy which is the more electrically conductive which are carried out on part of the deposits of the metal or the alloy which is the less electrically conductive.

The zones with vertical cross-hatching represent the deposits of metal or alloy which is the less electrically conductive.

The terminals Pl1 and Pl2 are terminals to which electric wires which permit the measurement of the electromotive force produced by the thermopile will be connected.

Figure 4:
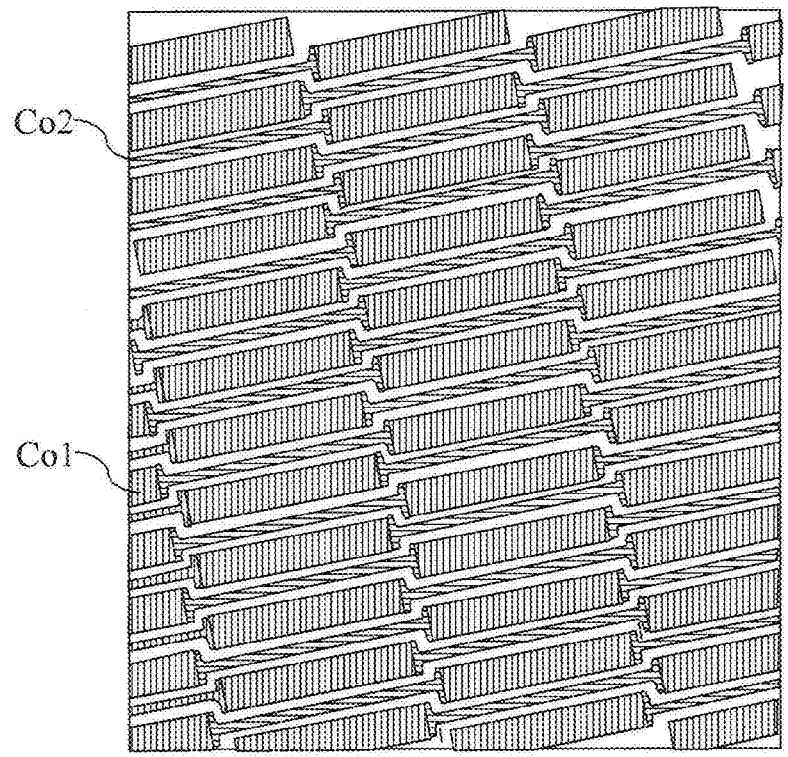
FIG. 4 is a particular embodiment of the geometry of the deposits of metals or alloys.

FIG. 4 is a particular embodiment of the geometry of the deposits of metals or alloys.

According to the particular embodiment of FIG. 4, the deposits of the metal or the alloy having the greater electrical conductivity are made on deposits of the metal or the alloy having the lesser electrical conductivity.

The deposits of the metal or the alloy having the greater electrical conductivity and the deposits of the metal or the alloy having the lesser electrical conductivity on which the deposits of the metal or the alloy having the greater electrical conductivity which are shown by horizontal cross-hatching are carried out have at their ends a width equal to the width of the deposits of the metal or the alloy, shown by vertical cross-hatching, having the lesser electrical conductivity and on which no deposit of metal or the alloy having the greater electrical conductivity is carried out.

The deposits of the metal or the alloy having the greater electrical conductivity and the deposits of the metal or the alloy having the lesser electrical conductivity on which the deposits of the metal or the alloy having the greater electrical conductivity are carried out have in their intermediate part a width less than the width of the deposits of the metal or the alloy having the lesser electrical conductivity and on which no deposit of metal or the alloy having the greater electrical conductivity is carried out.

Figure 5:
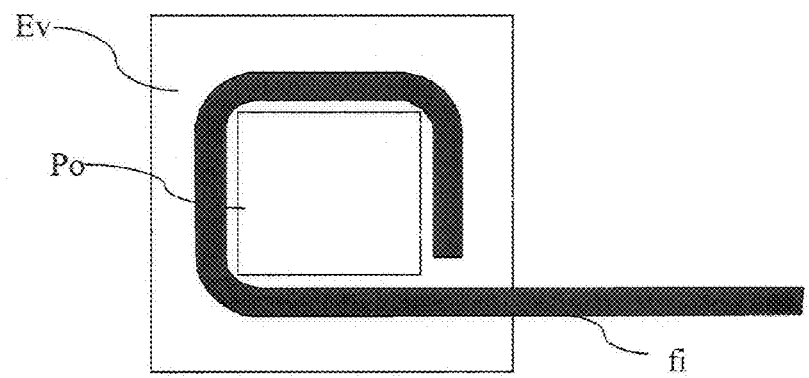
FIG. 5 is a diagrammatic view of the machining of the second substrate in each part facing a contact terminal of the thermopile, and of the placement of the wire in the machined part.

FIG. 5 is a diagrammatic view of the machining of the second substrate in each part facing a contact terminal of the thermopile, and of the placement of the wire in the machined part.

The second substrate is machined in each part facing a contact terminal so as to create a recess Ev around a block Po.

The wire Fi is wound around the block Po which is arranged in the centre of the recess.

For example, the block Po is a square with sides of 2 mm.

The recess is formed in a square with sides of 4 mm over a width of 1 mm.

Figure 6:
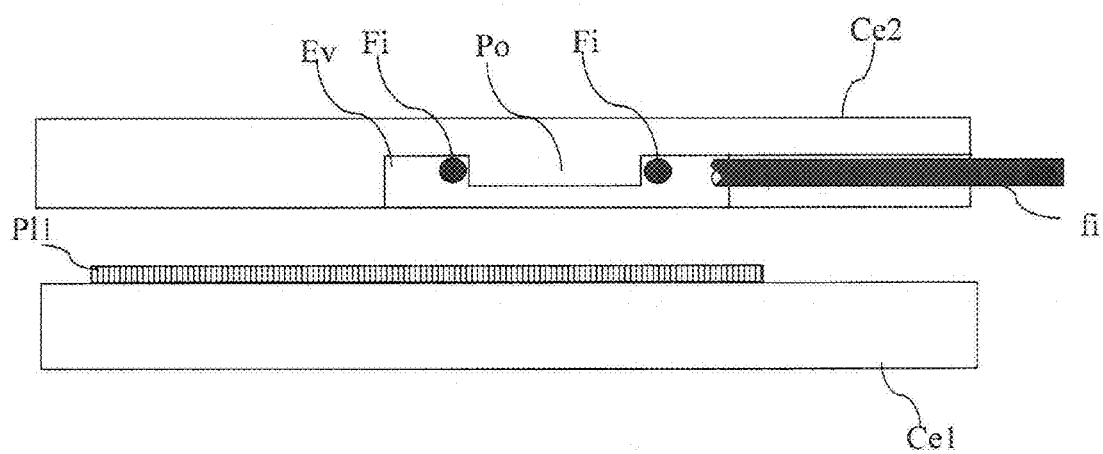
FIG. 6 is a section through the machining of the second substrate in a part facing a contact terminal of the thermopile, and the placement of the wire in the machined part.

FIG. 6 is a section through the machining of the second substrate in a part facing a contact terminal of the thermopile, and the placement of the wire in the machined part.

The thermopile deposited on the substrate Ce1 comprises a first and a second contact terminal.

In the example of FIG. 6, the terminal Pl1 is facing the recess Ev in which the wire Fi surrounding the block Po is placed.

Figure 7:
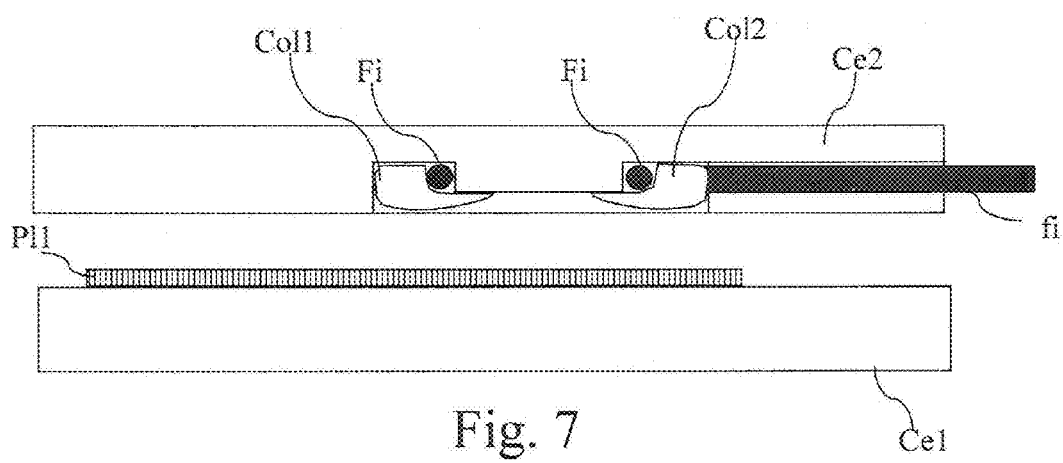
FIG. 7 is a section through the machining of the second substrate in a part facing a contact terminal of the thermopile, and the gluing of the wire in the machined part.

FIG. 7 is a section through the machining of the second substrate in a part facing a contact terminal of the thermopile, and the gluing of the wire in the machined part.

In a first phase, the wire Fi is fixed to the substrate Ce2 by means of a conductive glue.

The blocks of conductive glue are referenced Col1 and Col2 in FIG. 7.

It should be pointed out that the blocks of conductive glue Col1 and Col2 must not stand out above the non-machined surface of the substrate Ce2, so as to ensure that the gluing of the two substrates is carried out on planar surfaces.

Figure 8:
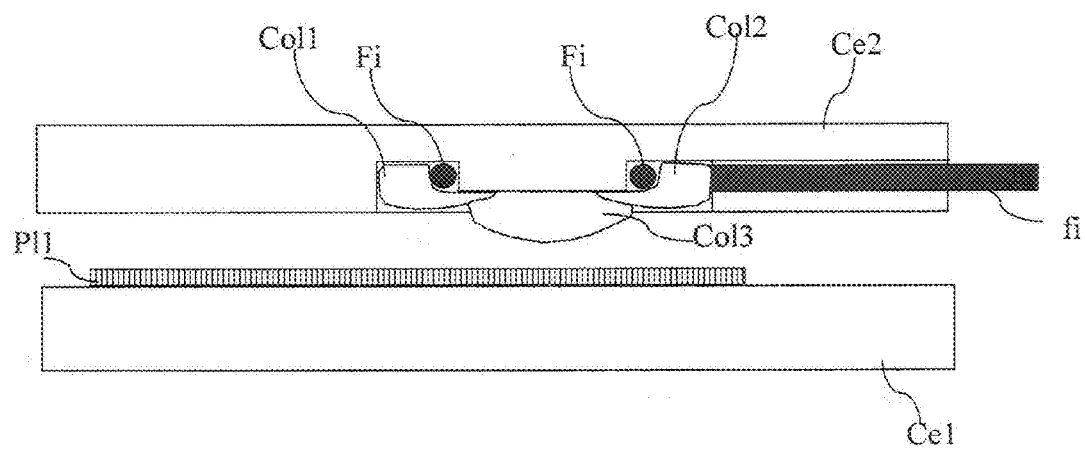
FIG. 8 is a section through the machining of the second substrate in a part facing a contact terminal of the thermopile, and the establishment of the electrical connection between the wire which is glued into the machined part and a contact terminal of the thermopile.

FIG. 8 is a section through the machining of the second substrate in a part facing a contact terminal of the thermopile, and the establishment of the electrical connection between the wire glued into the machined part and a contact terminal of the thermopile.

The electrical connection between the wire Fi and the contact terminal Pl1 is established by applying a dot of electrically conductive glue Col3 to the dots of glue Col1 and Col2 in the solid state and to the block Po.

When gluing the substrates Ce1 and Ce2, the electrical connection between the wire Fi and the terminal Pl1 will be provided by the dot of glue Col3.

The manipulation and the placement of the substrates Ce1 and Ce2 are not interfered with by the wires because these are fixed to the substrate Ce2 by the dots of glue Col1 and Col2.

FIG. 9 is an example of an algorithm for manufacturing a device for measuring a heat flux according to the present invention.

In step E900, the first substrate Ce1 is milled on one of its faces, so as to obtain a face comprising cavities which are separated by ceramic spacers.

In step E901, the face which is located opposite the machined face of the substrate Ce1 is polished if the granularity of the substrate Ce1 is not compatible with the depositing of the thermopile.

In step E902, the thermopile is deposited on the polished face for example using a cathode sputtering method.

In step E903, the second substrate Ce2 is milled on one of its faces, so as to obtain a face comprising cavities which are separated by ceramic spacers.

In step E904, the connecting means which permits the measurement of the electromotive force is placed. This step will be described in greater detail with regard to FIG. 10.

In step E905, the two substrates Ce1 and Ce2 are glued with the aid of a non-electrically conductive glue.

The machined face of the second substrate Ce2 is glued to the face of the first substrate on which the thermopile was deposited.

FIG. 10 is an example of an algorithm for placing connecting means for a device for measuring a heat flux according to the present invention.

In step E100, the machined face of the second substrate is machined in each part facing a contact terminal so as to create a recess Ev around a block Po.

In step E101, a wire is placed around each block Pl in the recess.

In step E102, each wire is glued to the second substrate using an electrically conductive glue.

In step E103, a block of electrically conductive glue is placed on the block Po and on the blocks of electrically conductive glue deposited in step E102.

Of course, the present invention is in no way limited to the embodiments described here, but, quite to the contrary, covers all variants within the scope of the person skilled in the art, and particularly the combination of different embodiments of the present invention.

The invention claimed is:

1. A device for measuring a heat flux, comprising a thermopile formed of a plurality of thermojunctions of distributed type, wherein the device is formed of a first and a second ceramic substrate, a first face of the first substrate is composed of cavities which are separated by ceramic spacers, the thermopile is placed on a second planar face of the first substrate which is located opposite the first face, the spacers of the first substrate are arranged beneath one thermojunction in two of the thermopile, a face of the second substrate is composed of cavities which are separated by ceramic spacers, the spacers of the second substrate rest on a thermojunction beneath which a spacer of the first substrate is not arranged.

2. The device according to claim 1, wherein the ceramic has a thermal conductivity of between 0.5 and 15 W/m·K.

3. The device according to claim 1, wherein the ceramic has a thermal conductivity of 1.46 W/m·K.

4. The device according to claim 1, wherein the cavities and the spacers are obtained by machining the substrates.

5. The device according to claim 1, wherein the first and second substrates are glued to one another by means of the spacers of the second substrate, the face of the second substrate which is composed of cavities which are separated by ceramic spacers from the second face of the first substrate, and the thermopile.

6. The device according to claim 1, wherein the thermopile is formed of a continuous strip composed alternatively of deposits of a first and a second metal or alloy of different thermoelectric properties, the continuous strip is meandering and folded to form a quadrilateral, and each deposit of metal or alloy of a meander is juxtaposed with a different deposit of metal or alloy of another meander.

7. The device according to claim 1, wherein the thermopile is composed of deposits of plural metals or alloys having different electrical conductivities, the deposits of the metal or the alloy having the greater electrical conductivity are carried out on deposits of the metal or the alloy having the lesser electrical conductivity, and wherein the deposits of the metal or the alloy having the greater electrical conductivity and the deposits of the metal or the alloy having the lesser electrical conductivity on which the deposits of the metal or the alloy having the greater electrical conductivity are carried out have at their ends a width equal to the width of the deposits of the metal or the alloy having the lesser electrical conductivity and on which no deposit of metal or the alloy having the greater electrical conductivity is carried out, and have in their intermediate part a width which is less than the width of the deposits of the metal or the alloy having the lesser electrical conductivity and on which no deposit of metal or the alloy having the greater electrical conductivity is carried out.

8. The device according to claim 1, wherein the thermopile comprises a first contact terminal and a second contact terminal, each one of the first and second contact terminals being capable of being electrically connected to a wire, and the second substrate is machined in each part facing one of the first and second contact terminals, so as to permit winding of the wire around a block arranged in the centre of each machined part of the second substrate which faces one of the first and second contact terminals.

9. A method for manufacturing a device for measuring a heat flux, the device comprising a thermopile formed of a plurality of thermojunctions of distributed type, wherein the method comprises:
   machining a first ceramic substrate on one face in order to obtain cavities which are separated by ceramic spacers,
   depositing the thermopile on the second planar face of the first substrate, the spacers of the first substrate being arranged beneath one thermojunction in two of the thermopile,
   machining a second ceramic substrate on one face in order to obtain cavities which are separated by ceramic spacers, and
   gluing the machined face of the second substrate onto the face of the first substrate comprising the thermopile such that the spacers of the second substrate rest on a thermojunction beneath which a spacer of the first substrate is not arranged.

10. The method according to claim 9, wherein the method further comprises polishing the second planar face of the first substrate prior to depositing the thermopile.

11. The method according to claim 9, wherein the thermopile comprises a first contact terminal and a second contact terminal, each one of the first and second contact terminals being capable of being electrically connected to a wire, and wherein the method further comprises machining the second substrate in each part facing one of the first and second contact terminals, so as to permit winding of the wire around a block arranged in the centre of each machined part of the second substrate which faces one of the first and second contact terminals.

12. The method according to claim 11, wherein the method further comprises:
   winding each wire around the block,
   gluing each wire to the second substrate using a conductive glue, and
   establishing an electrical connection between each glued wire and a contact terminal using a conductive glue.

* * * * *